(12) United States Patent
Ikeda et al.

(10) Patent No.: US 7,141,735 B2
(45) Date of Patent: Nov. 28, 2006

(54) DYE-SENSITIZED PHOTOELECTRIC CONVERSION DEVICE

(75) Inventors: Masaaki Ikeda, Tokyo (JP); Koichiro Shigaki, Tokyo (JP); Teruhisa Inoue, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/333,305

(22) PCT Filed: Jul. 25, 2001

(86) PCT No.: PCT/JP01/06404

§ 371 (c)(1),
(2), (4) Date: Jan. 17, 2003

(87) PCT Pub. No.: WO02/11213

PCT Pub. Date: Feb. 7, 2002

(65) Prior Publication Data

US 2003/0152827 A1    Aug. 14, 2003

(30) Foreign Application Priority Data

Jul. 27, 2000    (JP) .............................. 2000-226864

(51) Int. Cl.
*H01L 31/042*    (2006.01)
*H01M 14/00*    (2006.01)

(52) U.S. Cl. ...................... 136/263; 136/256; 136/250; 429/111; 257/40; 257/431

(58) Field of Classification Search ................ 136/263, 136/256, 250; 429/111; 257/40, 431
See application file for complete search history.

(56) References Cited

U.S. PATENT DOCUMENTS

| | | | | |
|---|---|---|---|---|
| 6,310,282 B1 * | 10/2001 | Sakurai et al. | ............... | 136/263 |
| 6,335,481 B1 * | 1/2002 | Watanabe | .................... | 136/263 |
| 6,822,159 B1 * | 11/2004 | Ikeda et al. | .................. | 136/263 |
| 2003/0183271 A1 * | 10/2003 | Ikeda et al. | .................. | 136/263 |
| 2004/0074532 A1 * | 4/2004 | Ikeda et al. | .................. | 136/250 |
| 2004/0099306 A1 * | 5/2004 | Hara et al. | .................. | 136/263 |
| 2004/0187918 A1 * | 9/2004 | Ikeda et al. | .................. | 136/263 |
| 2006/0130249 A1 * | 6/2006 | Ikeda et al. | .................... | 8/550 |

FOREIGN PATENT DOCUMENTS

| | | | |
|---|---|---|---|
| EP | 0 911 841 | | 4/1999 |
| JP | 9-124964 | | 5/1997 |
| JP | 10-92477 A | * | 4/1998 |
| JP | 11-067285 | | 3/1999 |
| JP | 11-214731 | | 8/1999 |
| JP | 11-214731 A | * | 8/1999 |
| JP | 11-238905 | | 8/1999 |
| JP | 2000-12882 | | 1/2000 |
| JP | 2000-223167 | | 8/2000 |
| JP | 2000-223167 A | * | 8/2000 |
| WO | 91/16719 | | 10/1991 |
| WO | WO 98/50393 A1 | * | 11/1998 |

OTHER PUBLICATIONS

Matsumoto et al, "Fabrication of solid-state dye-sensitized TiO2 solar cell using polymer electrolyte," Bull. Chem. Soc. Jpn., vol. 74, pp. 387-393 (2001).*
Kitamura et al, "Phenyl-conjugated oligoene sensitizers for TiO2 solar cells," Chem. Mater., vol. 16, pp. 1806-1812 (2004).*
Copy of the International Search Report dated Sep. 18, 2001.

* cited by examiner

*Primary Examiner*—Alan Diamond
(74) *Attorney, Agent, or Firm*—Nields & Lemack

(57) ABSTRACT

The present invention relates to an organic dye-sensitized semiconductor device and to a solar cell using it and, particularly, to a photoelectric conversion device using semiconductor fine particles sensitized with a dye having an acrylic acid part and a solar cell using it. According to the present invention, a low-cost photoelectric conversion device having favorable conversion efficiency and a solar cell can be obtained.

17 Claims, No Drawings

DYE-SENSITIZED PHOTOELECTRIC CONVERSION DEVICE

TECHNICAL FIELD

The present invention relates to photoelectric conversion devices using semiconductor fine particles sensitized with organic dye(s) and solar cells using semiconductor fine particles sensitized with organic dye(s), and in particular to a photoelectric conversion device characterized by using oxide semiconductor fine particles sensitized with a dye having an acrylic acid part(s) and a solar cell utilizing the same.

BACKGROUND OF THE INVENTION

A solar cell utilizing sunlight as an alternative energy source to a fossil fuel such as petroleum, coal or the like has been in the spot light. Today, developments and studies are being conducted on enhancement of efficiency and the like of a silicon solar cell which uses crystalline or amorphous silicon, a compound semiconductor solar cell which uses gallium, arsenic or the like. However, since much energy is required for producing these solar cells and the cost of them is high, there is a problem that it is difficult to put them to general use. Further, a photoelectric conversion device which uses semiconductor fine particles sensitized with dye(s) and a solar cell which uses this device have been known whereupon materials for use in producing them and techniques for producing them have been disclosed. (B. O'Regan and M. Gratzel Nature, 353, 737 (1991), M. K. Nazeeruddin, A. Kay, I. Rodicio, R. Humphry-Baker, E. Muller, P. Liska, N. Vlachopoulos, M. Gratzel, J. Am. Chem. Soc., 115, 6382 (1993) e.t.c.). This photoelectric conversion device is produced by using a comparatively low-cost oxide semiconductor such as titanium oxide or the like. Since there is a possibility that a photoelectric conversion device can be obtained in low cost compared with a solar cell which uses a conventional silicon or the like, this device has been remarked. However, in order to obtain a device having high conversion efficiency, a ruthenium-type complex is used as a sensitizing-dye wherein the dye itself is high in cost and there also is a problem in supply thereof. Further, although it has already been attempted to use an organic dye as a sensitizing-dye, it is a present situation that, due to low conversion efficiency and the like, it has not yet been used practically.

A development of a photoelectric conversion device, using an organic dye-sensitized semiconductor, which has high conversion efficiency as well as high practicability has been required.

DISCLOSURE OF THE INVENTION

The present inventors have made an extensive effort to solve the above-described problems and, as a result, have found that a photoelectric conversion device having high conversion efficiency can be obtained by sensitizing semiconductor fine particles with a dye having an acrylic acid part, namely, ethylenic double bond residue having a carboxyl group and, then, producing a photoelectric conversion device to achieve the present invention.

Namely, the present invention relates to (1) a photoelectric conversion device, characterized by comprising oxide semiconductor fine particles sensitized with a dye having an acrylic acid part, (2) a photoelectric conversion device, characterized by comprising oxide semiconductor fine particles sensitized with a dye represented by the following formula (1) having an acrylic acid part:

wherein A1 and A2 each independently represent a carboxyl group, a cyano group, an alkoxycarbonyl group, an acyl group, a nitro group, a cyclic hydrocarbon residue which may be substituted, a heterocyclic residue which may be substituted, an amino group which may be substituted, a hydroxyl group, a hydrogen atom, a halogen atom or an alkyl group which may be substituted; X represents an aromatic hydrocarbon residue which may be substituted, a heterocyclic residue which may be substituted, an organic metal complex residue which may be substituted or an amino group which may be substituted; n represents an integer from 1 to 6; and, when n is 2 or more, that is, a plurality of A1 and a plurality of A2 are present, each A1 and each A2 independently represent any one of the above-described groups or residues which may be same with or different from each other, and further, except for the A1 bound to the carbon atom to which the carboxyl group in an acrylic part is bound, two A1s or each A1 in a plurality of A1, A2 or each A2 in a plurality of A2 and X may be bound together to form a ring which may be substituted, (3) the photoelectric conversion device as mentioned in the above-described (2), wherein n is from 1 to 3 in the formula (1), (4) the photoelectric conversion device as mentioned in the above-described (2), characterized by that at least one of A1 and A2 or, when plural A1s and plural A2s are present, at least one thereof is a cyano group or a carboxyl group in the formula (1), (5) the photoelectric conversion device as mentioned in the above-described (4), characterized by that A1 in the formula (1) is a cyano group or a carboxyl group wherein the A1 binds to the same carbon atom as that the carboxyl group in an acrylic part is bound to.

(6) the photoelectric conversion device as mentioned in any one of the above-described (2) to (5), wherein X in the formula (1) is an aromatic hydrocarbon residue having a substituted amino group, (7) the photoelectric conversion device as mentioned in any one of the above-described (2) to (5), wherein the heterocyclic residue is a heterocyclic residue which is a 5- or 6-membered ring containing from 1 to 3 hetero atoms and may be substituted, or a heterocyclic residue comprising a condensed ring, having from 8 to 15 carbon atoms, which contains a 5- or 6-membered heterocycle containing from 1 to 3 hetero atoms, (8) the photoelectric conversion device as mentioned in the above-described (6), wherein X of the formula (1) is an aromatic hydrocarbon residue comprising an aromatic ring having from 6 to 16 carbon atoms, (9) the photoelectric conversion device as mentioned in the above-described (8), wherein the aromatic hydrocarbon residue in X of the formula (1) is a phenyl group having a mono- or di- (C1 to C4) alkyl-substituted amino group, wherein the above-described phenyl group may further be substituted by one or two substituents selected from the group consisting of a halogen atom, an alkyl group having from 1 to 4 carbon atoms and an alkoxy group having from 1 to 4 carbon atoms,

(10) the photoelectric conversion device as mentioned in any one of the above-described (1) to (9), characterized by comprising oxide semiconductor fine particles sensitized with simultaneously two or more sensitizing-dyes comprising at least one dye having an acrylic acid part,

(11) the photoelectric conversion device as mentioned in the above-described (10), characterized by comprising oxide semiconductor fine particles sensitized with simultaneously three or more types of sensitizing-dyes,

(12) the photoelectric conversion device as mentioned in any one of the above-described (1) to (11), wherein the oxide semiconductor fine particles comprise titanium dioxide as an essential component,

(13) the photoelectric conversion device as mentioned in any one of the above-described (1) to (12), wherein a dye is adsorbed to the oxide semiconductor fine particles in the presence of an inclusion compound, and

(14) a solar cell, characterized by comprising the photoelectric conversion device as mentioned in any one of the above-described (1) to (13).

BEST MODE FOR CARRYING OUT THE INVENTION

The present invention will be described in detail below. A photoelectric conversion device according to the present invention uses an oxide semiconductor sensitized with a dye having an acrylic acid part. The dye having an acrylic acid part to be used in the present invention is not particularly limited, so long as the dye has an acrylic acid part, but, as being a favorable dye, is mentioned a dye represented by the following general formula (1):

wherein A1, A2, X and n each have the same meaning as described above.

Unless stated otherwise, the term "dye" herein represented by the general formula (1) is intended to mean any one of a free acid and a salt thereof represented by the general formula (1).

Examples of salts of compounds represented by the general formula (1) include a metallic salt of a carboxylic acid portion of the above-described formula, for example, a salt with an alkali metal, alkali earth metal or the like such as lithium, sodium, potassium, magnesium, calcium or the like, and a salt such as a quaternary ammonium salt such as an organic base, for example, tetramethyl ammonium, tetrabutyl ammonium, pyridinium, imidazolium or the like.

Further, A1 and A2 each independently represent a carboxyl group, a cyano group, an alkoxycarbonyl group, an acyl group, a nitro group, a cyclic hydrocarbon residue which may be substituted, a heterocyclic residue which may be substituted, an amino group which may be substituted, a hydroxyl group, a hydrogen atom, a halogen atom or an alkyl group which may be substituted. Furthermore, when a plurality of A1 and a plurality of A2 are present, each A1 and each A2 independently represent the above-described groups which may be identical with or different from each other.

As substituents in the cyclic hydrocarbon residue which may be substituted and the heterocyclic residue which may be substituted, mentioned are, but not particularly limited to, an alkyl group, an aryl group, a cyano group, an isocyano group, a thiocyanato group, an isothiocyanato group, a nitro group, a nitrosyl group, an acyl group, a halogen atom, a hydroxyl group, a phosphoric acid group, a phosphoric acid ester group, a mercapto group which may be or may not be substituted, an amino group which may be or may not be substituted, an amide group which may be or may not be substituted, an alkoxyl group, an alkoxyalkyl group, a carboxyl group, an alkoxycarbonyl group, a sulfo group and the like.

As alkyl groups, mentioned are saturated and unsaturated groups of straight-chain, branched-chain and cyclic types which may be substituted, wherein, they have preferably from 1 to 36 carbon atoms, and more preferably it is the straight-chain saturated alkyl group having from 1 to 20 carbon atoms which may be substituted. As the cyclic group, mentioned are, for example, a cycloalkyl having from 3 to 8 carbon atoms and the like. These alkyl groups may further be substituted by the above-described substituents (except alkyl groups).

As aryl groups, mentioned are groups, in which a hydrogen atom is removed from an aromatic ring, mentioned in the part of cyclic hydrocarbon residues mentioed below and the like. The aryl groups may further be substituted by the above-described groups or the like.

Examples of acyl groups include an alkyl carbonyl group having from 1 to 10 carbon atoms, an aryl carbonyl group and the like, and preferably the alkyl carbonyl group having from 1 to 4 carbon atoms. As a specific example, mentioned are an acetyl group, a propionyl group and the like.

As halogen atoms, mentioned are chlorine, bromine, iodine atoms and the like.

As phosphoric acid ester groups, mentioned are a phosphoric acid (C1 to C4) alkyl ester and the like.

As mercapto groups which are substituted or un substituted, mentioned are a mercapto group, an alkyl mercapto group and the like.

As amino groups which are substituted or unsubstituted, mentioned are an amino group, a mono- or dialkyl amino group, a mono- or diaromatic amino group and the like, and, as those, mentioned are a mono- or dimethyl amino group, a mono- or diethyl amino group, a mono- or dipropyl amino group, a monophenyl amino group, a benzyl amino group and the like.

As amide groups which are substituted or unsubstituted, mentioned are an amide group, an alkyl amide group, an aromatic amide group and the like.

Examples of alkoxyl groups include an alkoxyl group having from 1 to 10 carbon atoms and the like.

Examples of alkoxyalkyl groups include a (C1 to C10) alkoxy (C1 to C4) alkyl group and the like.

Examples of alkoxycarbonyl groups include an alkoxycarbonyl group having from 1 to 10 carbon atoms and the like.

Further, acidic groups such as a carboxyl group, a sulfo group, a phosphoric acid group and the like may be in a state in which they form salts, for example, salts of metals such as lithium, sodium, potassium, magnesium, calcium and the like, and quaternary ammonium salts such as tetramethyl ammonium, tetrabutyl ammonium, pyridinium, imidazolium and the like.

The cyclic hydrocarbon residue means a group obtained by removing a hydrogen atom from a cyclic hydrocarbon.

Examples of cyclic hydrocarbons include benzene, naphthalene, anthracene, phenanthrene, pyrene, indene, azulene, fluorene, cyclohexane, cyclopentane, cyclohexene, cyclopentene, cyclohexadiene, cyclopentadiene and the like and as cyclic hydrocarbon residues, mentioned are groups obtained by removing a hydrogen atom from each of these cyclic hydrocarbons.

The heterocyclic residue means a group obtained by removing a hydrogen atom from a heterocyclic compound and, as heterocyclic residues, illustrated are those mentioned in the part of heterocyclic residues represented by X mentioned below and the like. Examples of preferable heterocyclic residues in A1 or A2 include residues obtained by removing a hydrogen atom from each of cyclic compounds such as pyridine, pyrazine, piperizine, morpholine, indoline, thiophene, furan, oxazole, thiazole, indole, benzothiazole, benzoxazole, pyrazine, quinoline and the like, and these residues may be substituted as described above.

Further, A1 and A2 may be bound with each other to form a ring. Particularly, when n mentioned below is 2 or more and A1 and A2 are each present in a plurality number, any two thereof may be bound with each other to form a ring. When a ring is formed, any one of A1 and any one of A2 may be bound with each other without any specific limitation; however, ordinarily, adjacent A1 and A2, adjacent two A1 or adjacent two A2 form the ring therebetween. The above-described ring may be substituted. As substituents in a case in which such substituents may be had, mentioned are substituents described in the part of the above-described cyclic hydrocarbon residues which may be substituted. As a ring which is formed by allowing A1 and A2, or anyone of A1s which are present in a plural number and any one of A2s which are present in a plural number to be bound with each other, mentioned are an unsaturated hydrocarbon ring or a heterocycle. As such unsaturated hydrocarbon rings, mentioned are a benzene ring, a naphthalene ring, an anthracene ring, a phenanthrene ring, a pyrene ring, an indene ring, an azulene ring, a fluorene ring, a cyclobutene ring, a cyclopentene ring, a cyclohexene ring, a cyclohexadiene ring, a cyclopentadiene ring and the like; as such heterocycles, mentioned are a pyridine ring, a pyrazine ring, an indoline ring, a thiophene ring, a furan ring, a pyran ring, an oxazole ring, a thiazole ring, an indole ring, a benzothiazole ring, a benzoxazole ring, a pyrazine ring, a quinoline ring, a carbazole ring, a benzopyran ring and the like. Among these rings, the cyclobutene ring, the cyclopentene ring, the cyclohexene ring, the pyran ring and the like are preferable. Further, when A1 or A2 has a carbonyl group, a thiocarbonyl group or the like, a cycloketone, a cyclothioketone or the like may be formed. Examples of compounds which form these rings include compounds exemplified in the compound from No. 110 to compound No. 118, No. 127 and the like mentioned below.

Preferably A1 and A2 are each independently a carboxyl group, a cyano group, an alkoxycarbonyl group, an acyl group, a hydroxyl group, a hydrogen atom, a halogen atom or an alkyl group. Among these groups, the carboxyl group, the cyano group, the hydrogen atom, the halogen atom, the alkyl group are more preferable. Among such halogen atoms, a chlorine atom, a bromine atom and an iodine atom are preferable. Further, when, in the formula (1), A1 is bound to a same carbon atom as that the carboxyl group is bound to, the carboxyl group or the cyano group is particularly preferable.

n is an integer of from 1 to 6.

When n is 1, the general formula (1) is represented by the following formula (2):

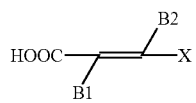

(2)

wherein B1 and B2 each independently represent a carboxyl group, a cyano group, an alkoxycarbonyl group, an acyl group, a nitro group, a cyclic hydrocarbon residue which may be substituted, a heterocyclic residue which may be substituted, an amino group which may be substituted, a hydroxyl group, a hydrogen atom, a halogen atom or an alkyl group which may be substituted, and further a ring which may be substituted may be formed by using a number of parts of B1, B2 or X; and X represents an aromatic hydrocarbon residue which may be substituted, a heterocyclic residue which may be substituted, an organic metal complex residue which may be substituted or an amino group which may be substituted. Substituent(s) in B1 and B2 may be the same as those mentioned in the above-described A1 and A2. As preferable combinations among these B1 and B2, mentioned are combinations that B1 is a carboxyl group, a cyano group or a hydroxyl group and B2 is a carboxyl group, a cyano group, a halogen atom, an alkyl group or a hydrogen atom. As more preferable combinations, mentioned are combinations that B1 is a carboxyl group or a cyano group and B2 is a hydrogen atom.

When n is 2, the general formula (1) is represented by the following formula (3):

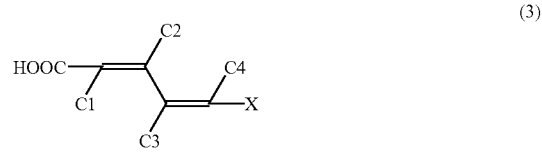

(3)

wherein C1, C2, C3 and C4 each independently represent a carboxyl group, a cyano group, an alkoxycarbonyl group, an acyl group, a nitro group, a cyclic hydrocarbon residue which may be substituted, a heterocyclic residue which may be substituted, an amino group which may be substituted, a hydroxyl group, a hydrogen atom, a halogen atom or an alkyl group which may be substituted, and a ring which may be substituted may be formed by using a number of parts of C1, C2, C3, C4 or X; and X represents an aromatic hydrocarbon residue which may be substituted, a heterocyclic residue which may be substituted, an organic metal complex residue which may be substituted or an amino group which may be substituted. C1, C2, C3 and C4 represent the same groups as those mentioned in the above-described A1 and A2 whereupon substituents and the like are also the same as those mentioned in the above-described A1 and A2. As preferable combinations among these groups, mentioned are combinations that C1 is a carboxyl group, a cyano group, an alkoxycarbonyl group, an acyl group or a hydroxyl group, and C2, C3 and C4 each independently are a carboxyl group, a cyano group, a halogen atom, an alkyl group or a hydrogen atom. As more preferable combinations, mentioned are combinations that C1 is a carboxyl group or a cyano group, and C2, C3 and C4 are hydrogen atoms.

When n is 3, the general formula (1) is represented by the following formula (4):

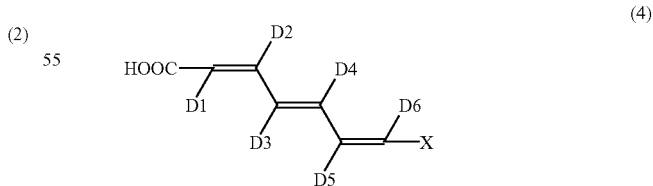

(4)

wherein D1, D2, D3, D4, D5 and D6 each independently represent a carboxyl group, a cyano group, an alkoxycarbonyl group, an acyl group, a nitro group, a cyclic hydrocarbon residue which may be substituted, a heterocyclic residue which,may be substituted, an amino group which maybe substituted, a hydroxyl group, a hydrogen atom, a halogen atom or an alkyl group which may be substituted, wherein a ring which may be substituted may be formed by using a number of parts of D1, D2, D3, D4, D5, D6 or X; and X represents an aromatic hydrocarbon residue which may be substituted, a heterocyclic residue which may be substituted, an organic metal complex residue which may be substituted or an amino group which may be substituted. D1, D2, D3, D4, D5 and D6 represent same groups as those mentioned in the above-described A1 and A2 whereupon substituents and the like are also same as those mentioned in the above-described A1 and A2. As preferable combinations among these groups, mentioned are combinations that D1 is a carboxyl group, a cyano group, an alkoxycarbonyl group, an acyl group or a hydroxyl group, and D2, D3, D4, D5 and D6 each independently are a carboxyl group, a cyano group, a halogen atom, an alkyl group or a hydrogen atom. As more preferable combinations, mentioned are combinations that D1 is a carboxyl group or a cyano group, and D2, D3, D4, D5 and D6 are hydrogen atoms.

X represents an aromatic hydrocarbon residue which may be substituted, a heterocyclic residue which may be substituted, an organic metal complex residue which may be substituted or an amino group which may be substituted.

The aromatic hydrocarbon residue means a group obtained by removing a hydrogen atom from an aromatic hydrocarbon. As the group obtained by removing a hydrogen atom from an aromatic hydrocarbon, mentioned are for example benzene, naphthalene, anthracene, phenanthrene, pyrene, indene, azulene, fluorene and the like and these groups each may be substituted as described above. Each of these aromatic hydrocarbon residues ordinarily has an aromatic ring (aromatic ring and condensation ring containing an aromatic ring or the like) having from 6 to 16 carbon atoms.

As the heterocyclic residue which may be substituted, mentioned is a group obtained by removing a hydrogen atom from a heterocyclic compound which may be substituted. Examples of such heterocyclic compounds include pyridine, pyrazine, pyrimidine, pyrazole, pyrazolidine, thiazolidine, oxazolidine, pyran, chromene, pyrrole, benzimidazole, imidazoline, imidazolidine, imidazole, pyrazole, triazole, triazine, diazole, morpholine, indoline, thiophene, furan, oxazole, thiazine, thiazole, indole, benzothiazole, naphthothiazole, benzoxazole, naphthoxazole, indolenine, benzoindolenine, pyrazine, quinoline, quinazoline, carbazole and the like, and these compounds may have been subjected to ring-increasing or hydrogenation and said compounds may be substituted.

Further, when X is a heterocycle or the like, the heterocycle may be changed into a quaternary heterocycle and, the quaternary heterocycle may have a counter ion. There is no specific limitation on such counter ions, but ordinary anions are permissible. Specific examples thereof include $F^-$, $Cl^-$, $Br^-$, $I^-$, $ClO_4^-$, $BF_4^-$, $PF_6^-$, $OH^-$, $SO_4^{2-}$, $CH_3SO_4^-$, toluene sulfonic acid and the like and, among these, $Br^-$, $I^-$, $ClO_4^-$, $BF_4^-$, $PF_6^-$, $CH_3SO_4^-$ and toluene sulfonic acid are preferable. Further, instead of the counter ion, the heterocycle may be neutralized by an intramolecular or intermolecular acidic group such as a carboxyl group or the like.

As the amino group which may be substituted, mentioned are a unsubstituted amino group, a diphenylamino group, a monophenylamino group, a dialkylamino group, a monoalkylamino group, an alkylphenylamino goup, an alkoxyamino group, an acylamino group (for example, a benzoylamino group, an acetylamino group and the like) and the like.

As the organic metal complex residue, mentioned is a group obtained by removing a hydrogen atom from an organic complex compound. Examples of such organic complex compounds include ferrocene, ruthenocene, titanocene, zirconocene, phthalocyanine, a ruthenium bipyridyl complex and the like.

Further, X may be bound to A1 or A2 to form a ring which may be substituted. Examples of such rings include a benzene ring, a naphthalene ring, an indene ring, a pyridine ring, a pyrazine ring, a pyrimidine ring, a quinoline ring, a thiophene ring, an indolenine ring, a benzoindolenine ring, a pyrazole ring, a pyrazolidine ring, a thiazole ring, a thiazolidine ring, a benzothiazole ring, an oxazole ring, an oxazolidine, a benzoxazole ring, a pyran ring, a chromene ring, a pyrrole ring, an imidazole ring, a benzimidazole ring, an imidazoline ring, an imidazolidine, an indole ring, a furan ring, a carbazole ring, a pyran ring, a benzopyran ring, a phthalocyanine ring, a porphyrin ring, ferrocene and the like, and these rings each have may be hydrogenated. Specific examples thereof, as shown in compound example Nos. 90 to 92, from 112 to 115, 118 and the like, include an example in which, when X is an N-methyl-N-phenylamino group, X forms a benzothiazole ring, a benzoxazole ring or a benzopyrroline ring by binding to A2 which is a mercapto group, a hydroxy group or an isopropyl group, respectively, an example in which, when X is an N-ethyl-N-phenylamino group, X forms a quinoline ring by using A2 and methylene, and the like.

Further, as a substituent in a case in which the aromatic hydrocarbon residue, the heterocycle residue or the organic metal complex residue in X is substituted, or as a substituent in a case in which a ring formed by any two of the above-described X, A1 or A2 is substituted, mentioned are same substituents as those on the cyclic hydrocarbons described in the paragraph of the above-described A1 or A2, a carbonyl group, a thiocarbonyl group and the like.

Furthermore, when X, A1 or A2 which forms a ring has a carbonyl group or a thiocarbonyl group, a ring formed by any two of X, A1 and A2 may be a ring substituted by O= or S= as a substituent, that is, a cyclic ketone or a cyclic thioketone.

As a preferable substituent in the above-described aromatic hydrocarbon residue, heterocyclic residue or organic metal complex residue or the like in X, or a preferable substituent on a ring formed by using any two of X, A1 and A2, mentioned are an amino group which may be substituted, an alkyl group which may be substituted, an alkoxyl group which may be substituted, an acetyl group which may be substituted, a hydroxyl group, a halogen atom, O=, S= and the like. As a further preferable substituent, mentioned are an amino group which may be substituted, an alkyl group which may be substituted, an alkoxyl group which may be substituted, O= and S=. On this occasion, as the amino group which may be substituted, mentioned are a mono- or dialkyl-substituted amino group, a monoalkyl monoaryl-substituted amino group, a diaryl-substituted amino goup, a mono- or dialkylene-substituted amino group and the like and, the dialkyl-substituted amino group, the diaryl-substituted amino group are preferable. As the alkyl group which may be substituted, mentioned are an aryl-substituted alkyl group, a halogen atom-substituted alkyl group, an alkoxyl-substituted alkyl group and the like. As the alkoxyl group which may be substituted, mentioned are an alkoxy-substituted alkoxyl group, a halogen-substituted alkoxyl group, an aryl-substututed alkoxyl group and the like.

A compound represented by the above-described formula (1) is able to have structural isomers of a cis form, a trans form and the like. However, the compound can favorably be used as a photosensitizing-dye without any particular limitation of these structural isomers.

Among compounds represented by the formula (1), a compound (2) in a case of n=1 can be obtained by condensing, for example, an acetic acid derivative represented by the formula (5) and a carbonyl derivative represented by the formula (6) optionally in the presence of a basic catalyst such as piperidine, piperazine or the like in an organic solvent, preferably a polar solvent such as alcohol, for example, methanol, ethanol, propanol or the like at a reflux temperature.

Further, a compound (3) in a case of n=2 can similarly be obtained by condensing the acetic acid derivative represented by the formula (5) and a carbonyl derivative represented by the formula (7-1) optionally in the presence of the basic catalyst in a solvent such as the above-described alcohol or the like.

Furthermore, a derivative in a case of n=3 or more can be produced in a same manner by using a carbonyl derivative represented by the formula (7-2) in place of the carbonyl derivative represented by the formula (7-1). Still further, a derivative in which a ring is formed can be obtained by condensing an acetic acid derivative and a carbonyl derivative having a ring or a carbonyl derivative having a ring. For example, the derivative can be obtained by using a compound in which a ring is formed by A2 and X in the formula (7-1) or a compound in which a ring is formed by either A1 nearer to X and A2 nearer to X, or X and A1 or A2 in the formula (7-2).

Still furthermore, when the acetic acid derivative is poor in reactivity, an ester derivative thereof or a cyano derivative thereof is first prepared and, then, hydrolyzed to obtain the above-described compound or derivative.

A1—CH₂COOH                Formula (5)

A1—CH₂COOH                Formula (6)

A2—CO—C(A1)=C(A2)—X        Formula (7-1)

A2—CO—C(A1)=C(A2)—C(A1)=C(A2)—X     Formula (7-2)

wherein A1, A2 and X each represent a same compound as that described above.

Specific examples of compounds (dyes) used in the present invention will now be shown below.

Compound examples of derivatives (compounds represented by the above-described formula (2)) in a case of n=1 in the formula (1) are shown in Table 1. Compound Nos. 1 to 27 in Table 1 show examples of compounds represented by the formula (8) mentioned below, whereas compound Nos. 28 to 32 show examples of compounds in which X in the above-described formula (2) is a 4-(N-ethyl carbazole) group, a group of ferrocene, a group of 2-thiophene, a group of ruthenocene and a group of phthalocyanine, respectively. 4-DMA in Table 1 means 4-dimethyl aniline. Further, examples of R1, R2, B1, B2, B3 and B4 in the formula (8) are shown in Table 1.

TABLE 1

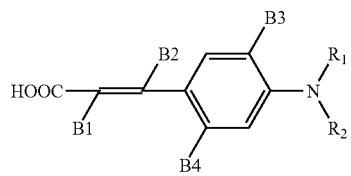

(8)

| Compound | B1 | B2 | R1 | R2 | B3 | B4 |
|---|---|---|---|---|---|---|
| 1 | CN | H | CH3 | CH3 | H | H |
| 2 | CN | H | C2H5 | C2H5 | H | H |
| 3 | CN | H | C4H9 | C4H9 | H | H |
| 4 | CN | H | C8H17 | C2H5 | H | H |
| 5 | CN | H | C18H37 | C18H37 | H | H |
| 6 | CN | H | C2H4OCH3 | C2H4OCH3 | H | H |
| 7 | CN | H | Phenyl | Phenyl | H | H |
| 8 | CN | H | p-tolyl | p-tolyl | H | H |
| 9 | CN | H | 4-DMA | 4-DMA | H | H |
| 10 | CN | H | C2H4Cl | CH3 | H | H |
| 11 | CN | H | Phenyl | Phenyl | H | H |
| 12 | CN | H | CH3 | CH3 | H | CH3 |
| 13 | CN | H | CH3 | CH3 | H | Cl |
| 14 | CN | H | H | COCH3 | H | H |
| 15 | CN | H | C2H5 | C2H5 | OCH3 | CH3 |
| 16 | CN | H | C2H5 | C2H5 | OCH3 | NHCOCH3 |
| 17 | CN | CN | C2H5 | C2H5 | H | H |
| 18 | CN | CN | C2H4CN | 2H4CN | H | H |
| 19 | COOH | H | C2H4Br | C2H4Br | H | H |
| 20 | CONHC2H5 | H | H | H | H | H |
| 21 | CN | H | H | H | H | H |
| 22 | NO2 | H | CH3 | C4H9 | H | H |
| 23 | COOCH3 | H | CH3 | CH3 | H | H |
| 24 | COCH3 | H | C2H5 | C2H5 | H | H |
| 25 | CONH2 | H | C2H5 | H | H | H |
| 26 | CN | 4-DMA | CH3 | CH3 | H | H |
| 27 | CN | Cl | CH3 | CH3 | H | H |
| 28 | CN | H | X = 4-(N-ethylcarbazole) | | | |

TABLE 1-continued

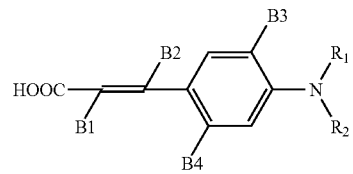

(8)

| Compound | B1 | B2 | R1 | R2 | B3 | B4 |
|---|---|---|---|---|---|---|
| 29 | CN | H | \multicolumn{2}{l}{X = ferrocene} | | |
| 30 | CN | H | \multicolumn{2}{l}{X = 2-thiophene} | | |
| 31 | CN | CN | \multicolumn{2}{l}{X = ruthenocene} | | |
| 32 | CN | H | \multicolumn{2}{l}{X = phtalocyanine} | | |

Examples of derivatives (compounds of the above-described (3)) of n=2 in the formula (1) are shown in Table 2.

Compound Nos. 33 to 45 are compound examples represented by the formula (9) described below in a case in which X is a substituted anilino group in the formula (3) whereas compound Nos. 46 to 49 are examples of compounds in a case in which X in the formula (3) is a 4-(N-ethyl carbazole) group, a group of 2-thiophene, a group of ferrocene or a group of phthalocyanine, respectively. Specific examples of respective group of substituents, R1, R2 and C1 to C6, are shown in Table 2. Further, in Table 2,4-dimethyl aniline and 4-diethyl aniline are abbreviated as 4-DMA and 4-DEA, respectively.

Other examples of compounds which are derivatives of n=1 and 2 in the formula (1) are shown below.

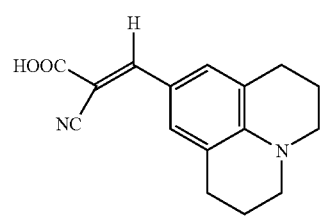

(50)

TABLE 2

(9)

| Compound | C1 | C2 | C3 | C4 | R1 | R2 | C5 | C6 |
|---|---|---|---|---|---|---|---|---|
| 33 | CN | H | H | H | CH3 | CH3 | H | H |
| 34 | COOH | H | H | H | CH3 | CH3 | H | H |
| 35 | CN | H | H | H | C2H4COOH | C2H4COOH | H | H |
| 36 | CN | H | H | Cl | C2H5 | C2H5 | H | H |
| 37 | COOH | H | H | H | C2H5 | C2H5 | OCH3 | NHCOCH3 |
| 38 | CN | H | H | H | C2H5 | C2H5 | H | OH |
| 39 | NO2 | H | H | H | CH3 | CH3 | H | H |
| 40 | COOH | H | H | H | phenyl | | phenyl | H |
| 41 | CN | H | H | H | phenyl | | phenyl | H |
| 42 | COOH | H | H | H | 4-DEA | 4-DEA | H | H |
| 43 | COOH | H | H | 4-DMA | CH3 | CH3 | H | H |
| 44 | COOC2H5 | H | H | H | C2H5 | C2H5 | H | H |
| 45 | COOPH | H | H | H | C8H17 | CH3 | H | H |
| 46 | CN | H | H | H | \multicolumn{2}{l}{X = 4-(N-ethlycarbazole)} | | |
| 47 | COOH | H | H | H | \multicolumn{2}{l}{X = 2-thiophene} | | |
| 48 | CN | H | H | H | \multicolumn{2}{l}{X = ferrocene} | | |
| 49 | CN | H | H | H | \multicolumn{2}{l}{X =phtalocyanine} | | |

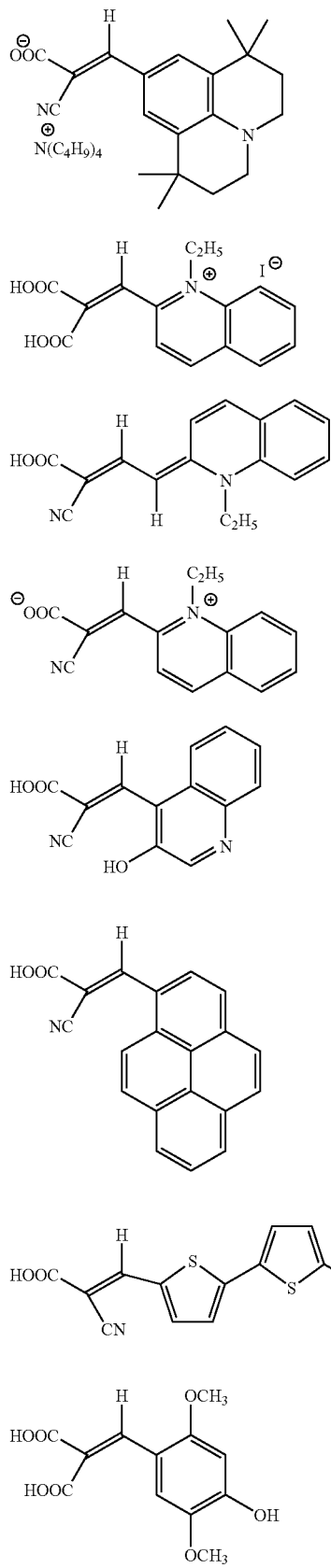
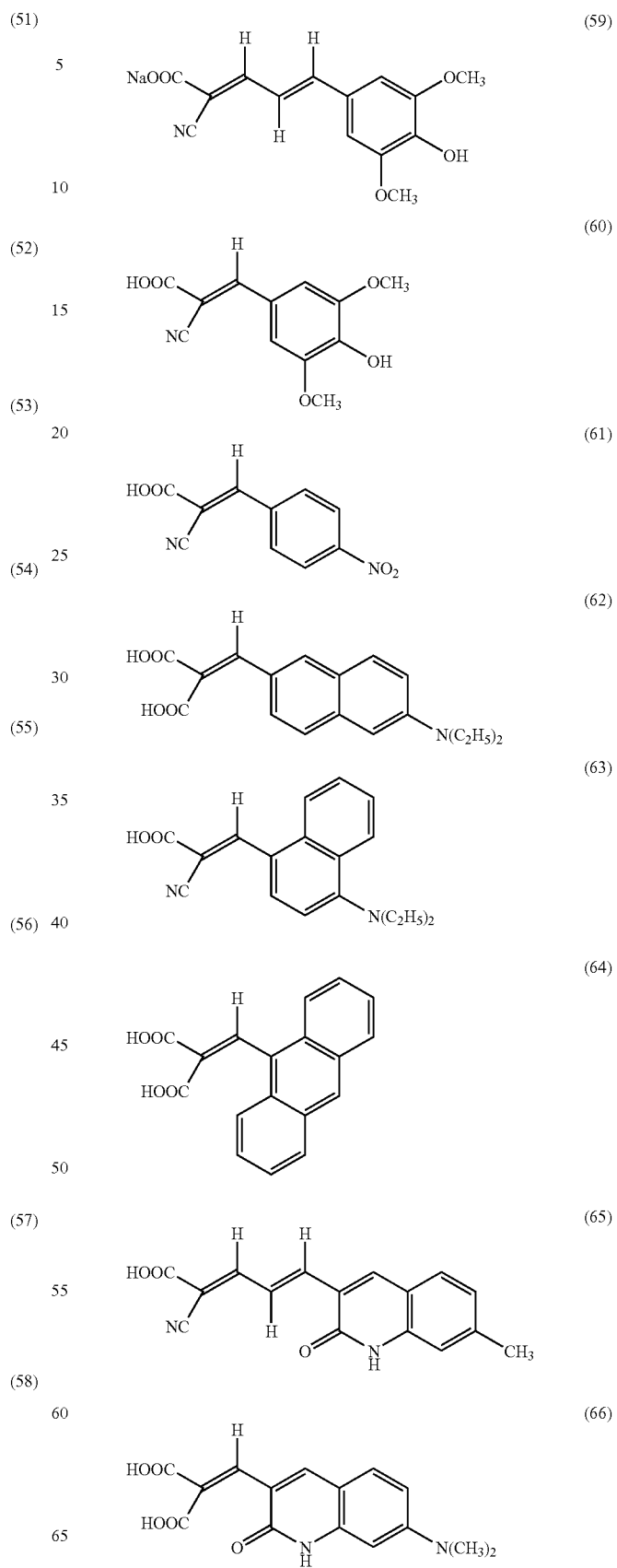

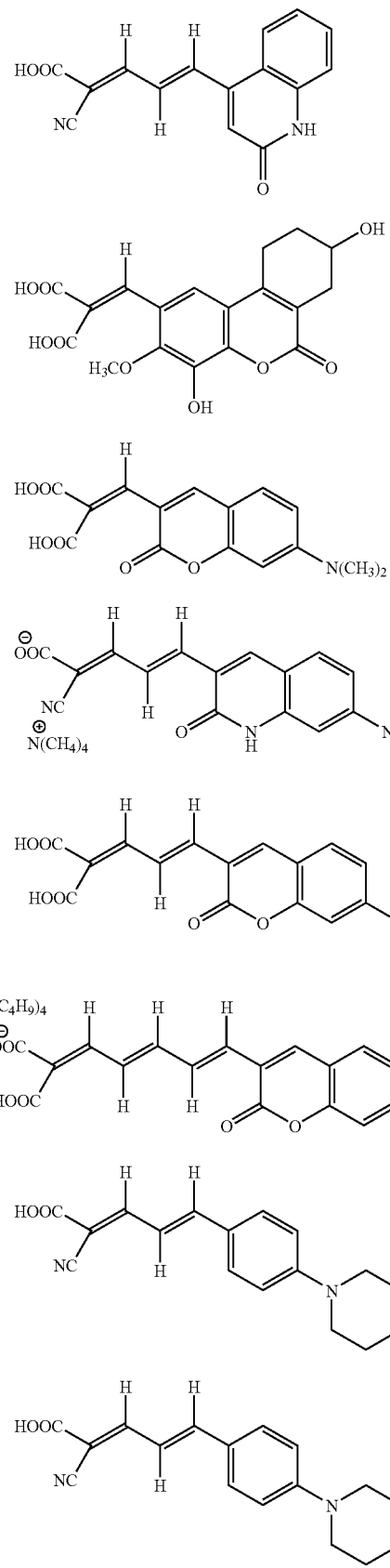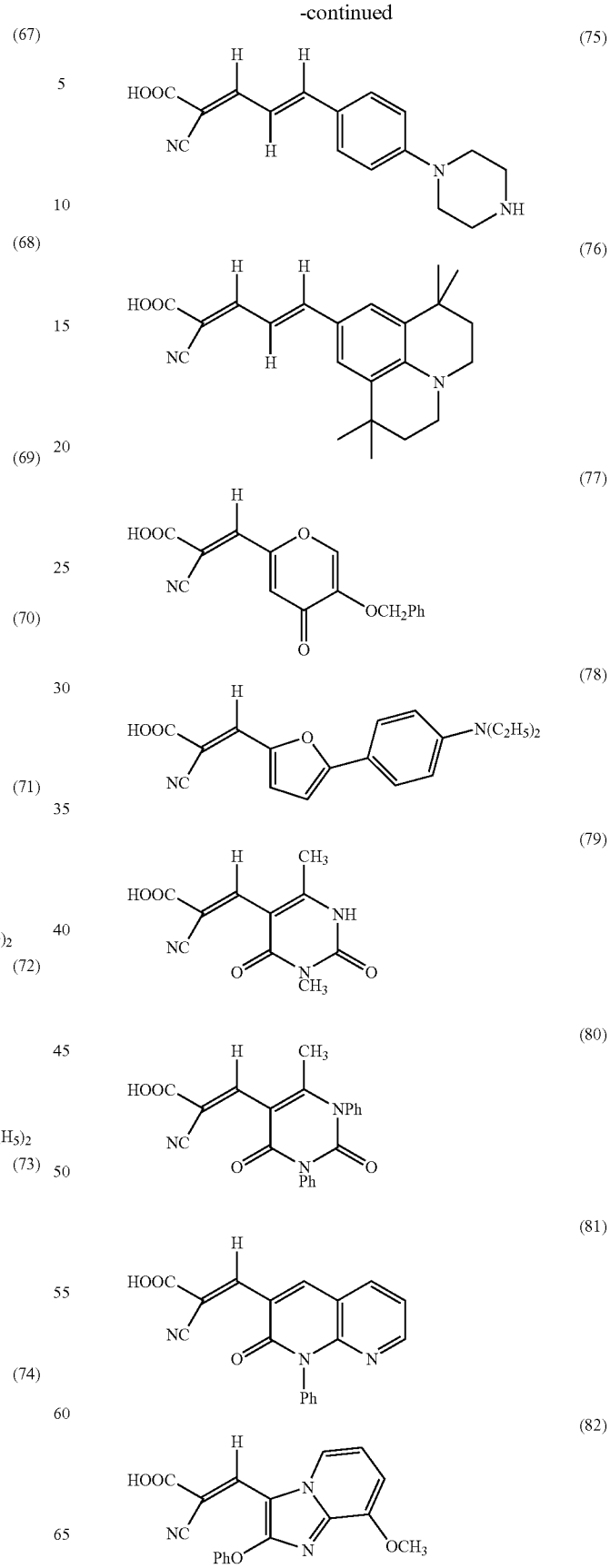

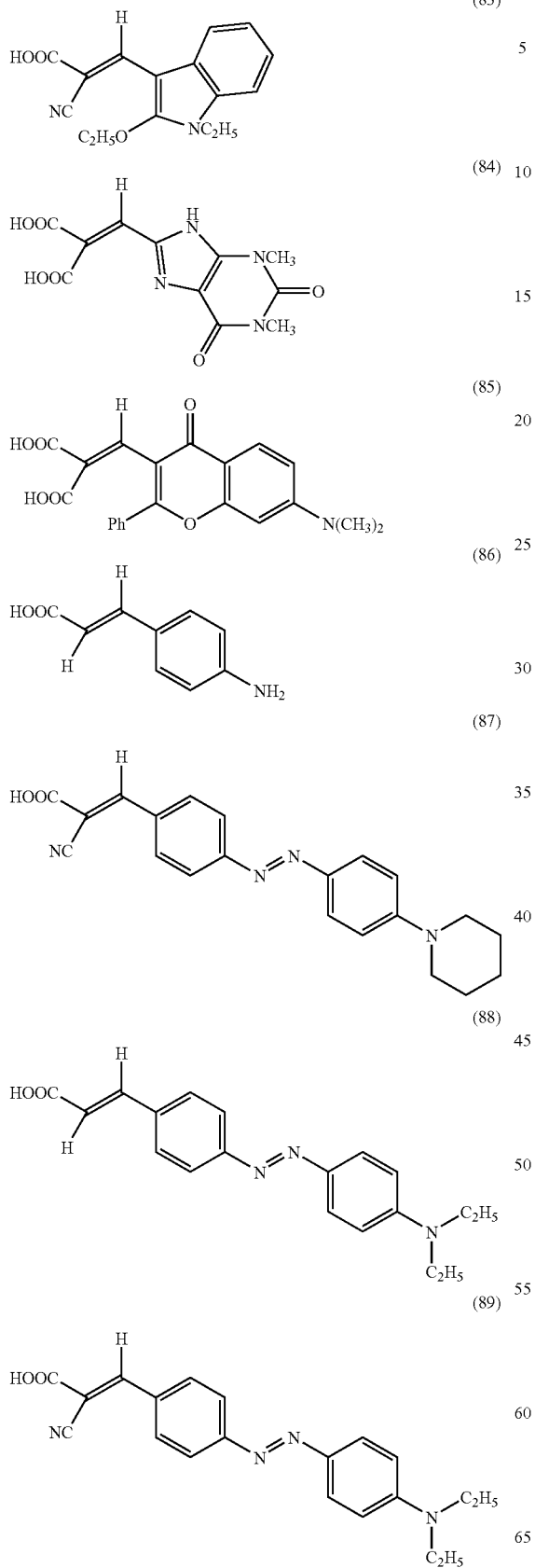
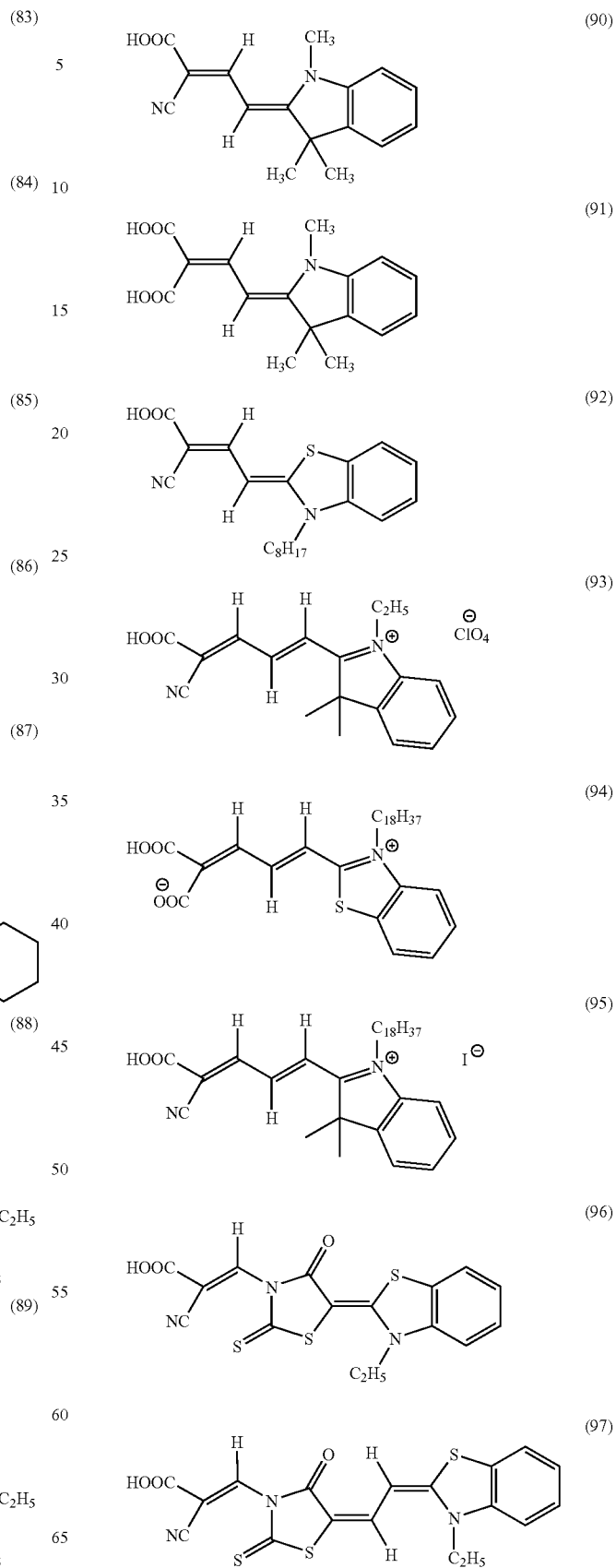

-continued
(98)
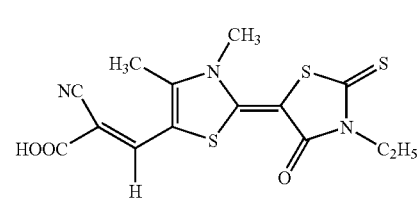
(99)
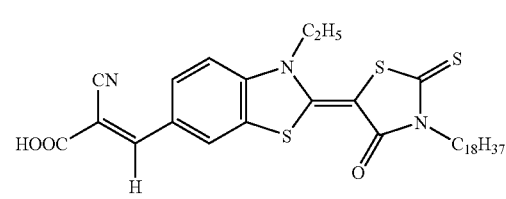
(100)
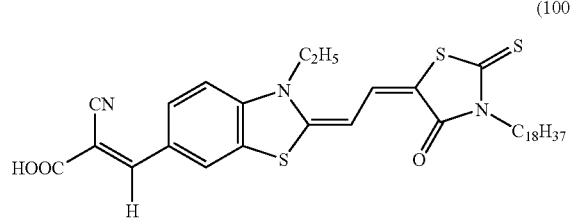
(101)
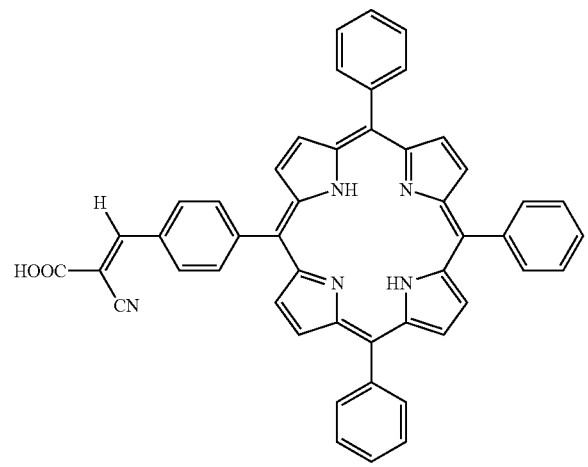
(102)
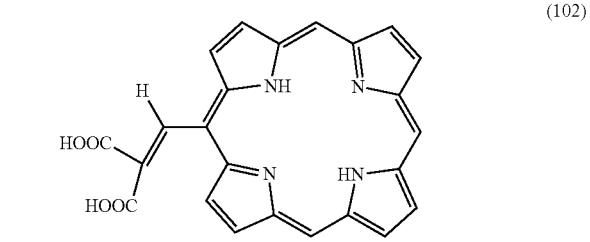
(103)
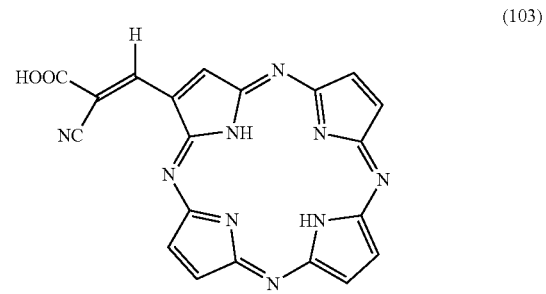
-continued
(104)
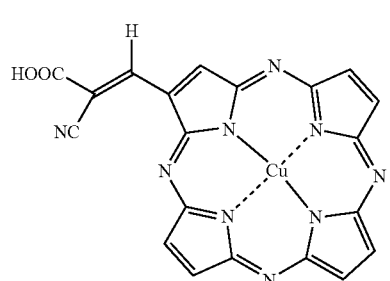
(105)
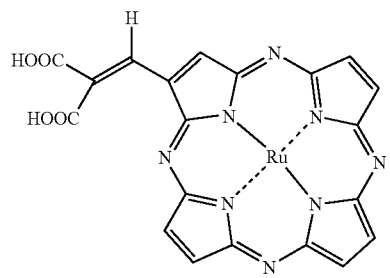
Representative examples of compounds which are derivatives of n=3 or more are shown below.
(106)
(107)
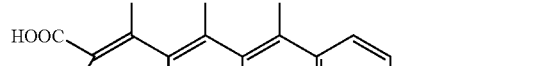
(108)
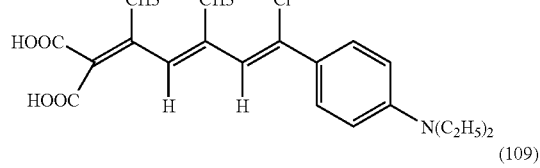
(109)
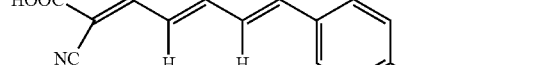
(110)
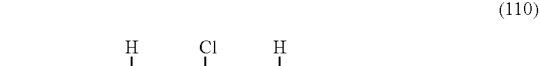

-continued
(111)
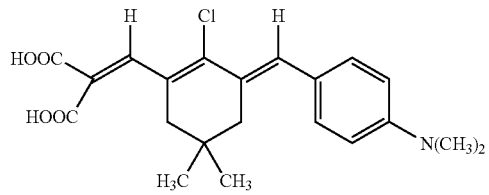
(112)
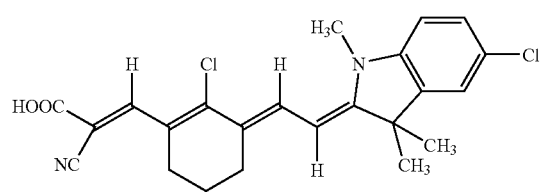
(114)
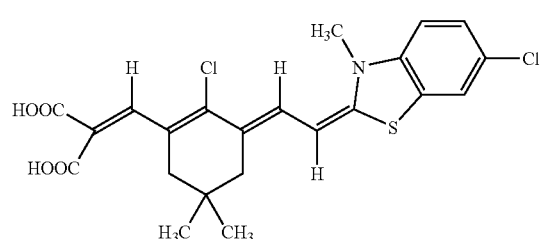
(115)
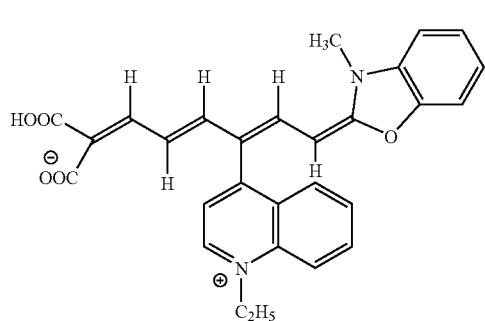
(116)
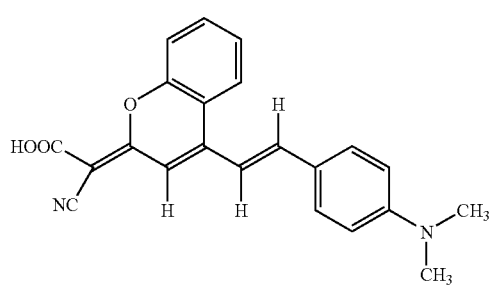
(117)
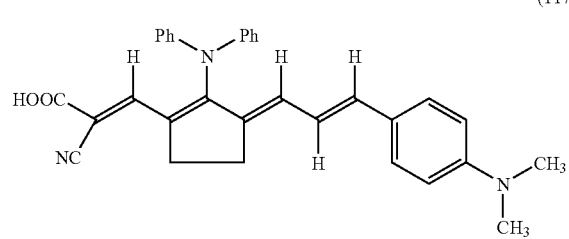
-continued
(118)
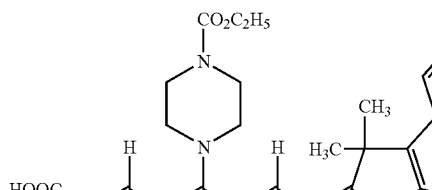
(119)
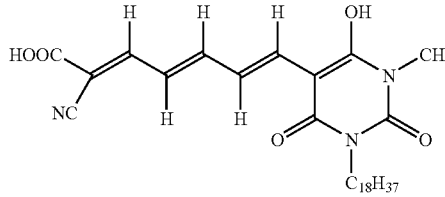
(120)
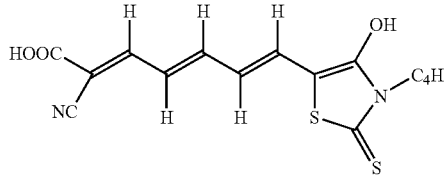
(121)
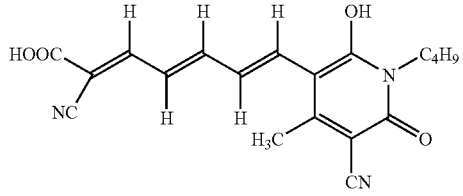
(122)
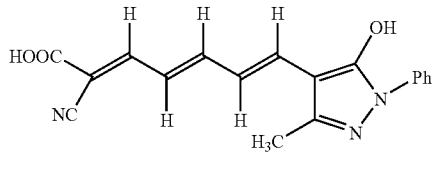
(123)
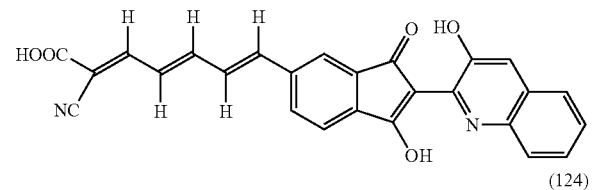
(124)
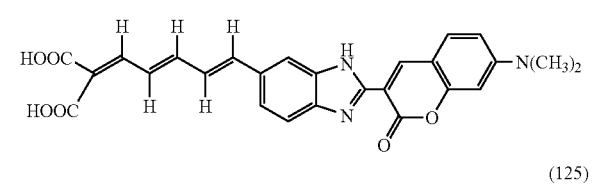
(125)
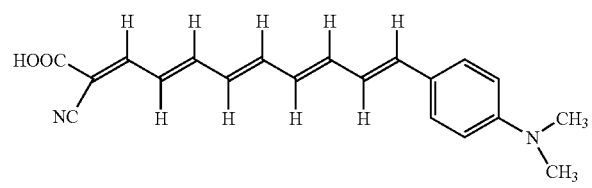

-continued

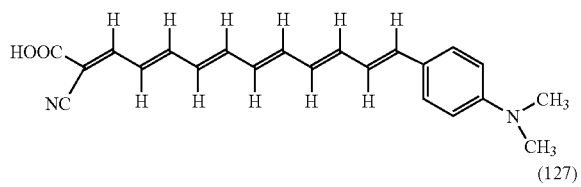
(126)

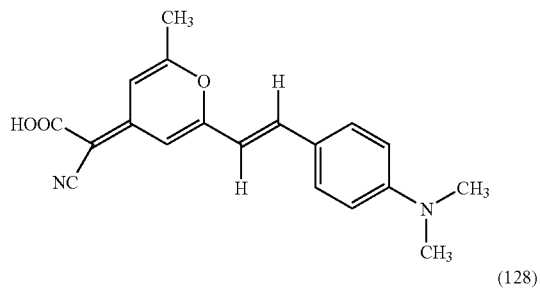
(127)

(128)

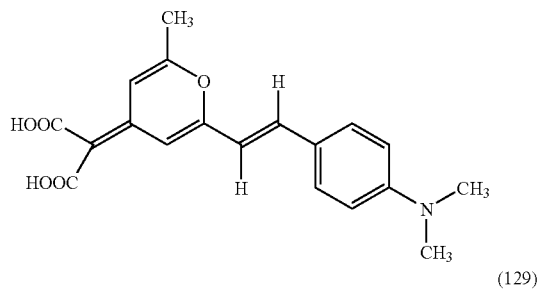
(129)

(130)

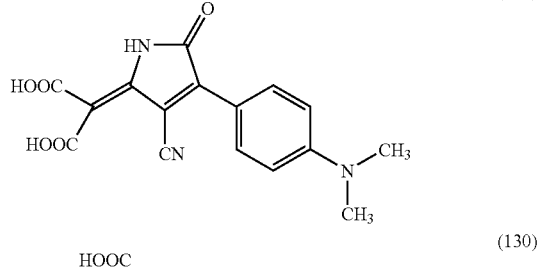

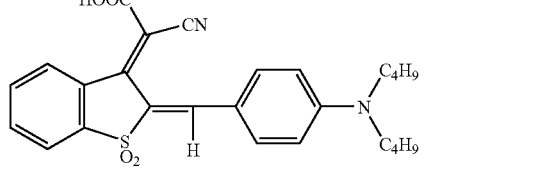

A dye-sensitized photoelectric conversion device according to the present invention is, for example, a device in which a thin film of an oxide semiconductor is produced on a substrate by using oxide semiconductor fine particles and then a dye is allowed to be adsorbed on the thus-produced thin film. As fine particles of the oxide semiconductor, a metal oxide is preferable; specific examples of such metal oxides include oxides of titanium, tin, zinc, tungsten, zirconium, gallium, indium, yttrium, niobium, tantalum, vanadium and the like. Among these oxides, oxides of titanium, tin, zinc, niobium, tungsten and the like are preferable and, above all, titanium oxide is most preferable. These oxide semiconductors can be used either alone or mixture thereof. An average particle diameter of the fine particles of the oxide semiconductor is ordinarily from 1 nm to 500 nm and preferably from 5 nm to 100 nm. These fine particles of the oxide semiconductor can also be used in a state of mixtures of large particle diameter ones and small particle diameter ones.

An oxide semiconductor thin film can be produced by a method in which oxide semiconductor fine particles are directly vapor-deposited on a substrate to form a thin film, a method in which an oxide semiconductor thin film is electrically precipitated by using a substrate as an electrode or a method in which a slurry of semiconductor fine particles to be described below is applied on a substrate, dried and cured or sintered. From the standpoint of performance of an oxide semiconductor electrode, a method which uses the slurry is preferable. In this method, the slurry can be obtained by dispersing the oxide semiconductor fine particles which, are in a secondary agglomeration state by a normal method such that an average primary particle diameter thereof comes to be from 1 nm to 200 nm in a dispersion medium.

Any dispersion medium of the slurry is usable, so long as it is capable of dispersing the semiconductor fine particles. Water or an organic solvent such as an alcohol such as ethanol or the like, a ketone such as acetone, acetylacetone or the like or a hydrocarbon such as hexane or the like is used and may be used in mixture thereof and, further, it is favorable to use water from a standpoint that it suppresses viscosity changes.

A temperature of sintering a substrate which has been coated with the slurry is ordinarily 300° C. or more, preferably 400° C. or more and a maximum allowable temperature thereof is approximately not greater than a melting point (softening point) of the substrate, ordinarily 900° C. as an upper limit and preferably 600° C. or less. Further, a period of time of sintering the substrate is not particularly limited, but is preferably within about 4 hours. Thickness of the thin film on the substrate is ordinarily from 1 μm to 200 μm and preferably from 5 μm to 50 μm.

The oxide semiconductor thin film may be subjected to a secondary treatment. Namely, for example, the thin film can directly be immersed together with the substrate in a solution of an alkoxide, a chloride, a nitride, a sulfide or the like of the same metal as the semiconductor and, then, dried or sintered again to enhance performance of the semiconductor thin film. Examples of such metal alkoxides include titanium ethoxide, titanium isopropoxide, titanium t-butoxide, n-dibutyl-diacetyl tin and the like and an alcoholic solution thereof is used. Examples of such chlorides include titanium tetrachloride, tin tetrachloride, zinc chloride and the like and an aqueous solution thereof is used.

Next, a method to adsorb a dye on the oxide semiconductor thin film is explained. As the above-described method for adsorbing the dye thereon, mentioned is a method in which a substrate on which the above-described oxide semiconductor thin film has been provided is immersed in a solution obtained by dissolving a dye in a solvent capable of dissolving the dye or in a dispersion liquid obtained by dispersing a dye which has a low solubility. A concentration of the dye in the solution or the dispersion liquid is appropriately determined depending on dyes. The semiconductor thin film formed on the substrate is immersed in the solution. An immersion temperature is approximately from normal temperature up to a boiling point of the solvent and, further, an immersion period of time is from about 1 hour to about 48 hours. Specific examples of solvents to be used in dissolving the dye include methanol, ethanol, acetonitrile, dimethylsulfoxide, dimethylformamide and the like. A concentration of the dye in the solution is ordinarily favorably from $1 \times 10^{-6}$ M to 1 M and preferably from $1 \times 10^{-6}$ M to $1\times10^{-1}$ M. In such a way as described above, a photoelectric conversion device of the oxide semiconductor thin film sensitized with the dye can be obtained.

The dye to be adsorbed may be composed of one type or a mixture of two or more types. When the dyes are mixed, the dyes which have an acrylic acid part according to the present invention may be mixed there among or mixed with any one of other dyes and metal complex dyes. Particularly, by mixing dyes having different absorption wavelengths from one another, a wider absorption wavelength can be utilized and, as a result, a solar cell having high conversion efficiency can be obtained. By utilizing three or more types of dyes, it becomes possible to even fabricate an optimum solar cell.

As examples of such metal complex dyes to be utilized for the mixture, there is no particular limitation thereon, but a ruthenium complex which have been disclosed in J. Am. Chem. Soc., 115, 6382 (1993) or JP-A-2000-26487, phthalocyanine, porphyrin and the like are preferable. Examples of organic dyes to be utilized for the mixture include dyes such as metal-free phthalocyanine, metal-free porphyrin, or methine-type dyes such as cyanine, merocyanine, oxonol, a triphenyl methane type and the like, a xanthene type, an azo type, an anthraquinone type and the like. Among these dyes, the ruthenium complex and methine-type dyes such as merocyanine and the like are preferable. A ratio of the dyes to be mixed is not particularly limited and is optimized according to respective dyes. However, it is ordinarily preferable to mix them in the range of between each equivalent mol and about 10% mol or more for a dye. When mixed dyes are adsorbed on the thin film of the oxide semiconductor fine particles by using a solution in which such mixed dyes are mix-dissolved or dispersed, a concentration of entire dyes in the solution may be same as that in a case in which only one type of dye is adsorbed.

When the dye is adsorbed on the thin film of the oxide semiconductor fine particles, it is effective to adsorb the dye in the presence of an inclusion compound in order to prevent dyes from associating with each other. Examples of such inclusion compounds include steroid-type compounds such as cholic acid and the like, crown ethers, cyclodextrin, calixarene, polyethylene oxide and the like. Cholic acid, polyethylene oxide and the like are preferable. Further, after the dye is adsorbed thereon, a surface of a semiconductor electrode may be treated with an amine compound such as 4-t-butylpyridine or the like. As a method for such treatment, for example, a method in which a substrate having a thin film, on which the dye is adsorbed, of the semiconductor fine particles is immersed in an ethanol solution of an amine or the like can be adopted.

The solar cell according to the present invention comprises a photoelectric conversion device electrode in which the dye is adsorbed on the above-described oxide semiconductor thin film, a counter electrode and a redox electrolyte or a hole transfer material. The redox electrolyte may be a solution in which a redox pair is dissolved in a solvent, a gel electrolyte that a polymer matrix is impreganated with a redox pair or a solid electrolyte such as a fused salt. Examples of hole transfer materials include an amine derivative, an electrically conductive polymer such as polyacetylene, polyaniline, polythiophene or the like, a material using a discotic liquid crystal phase such as polyphenylene and the like. The counter electrode to be used is preferably an electrode which has electric conductivity and catalytically acts on a reduction reaction of the redox electrolyte. For example, a material in which platinum, carbon, rhodium, ruthenium or the like is vapor-deposited on glass or a polymer film, or electrically conductive fine particles are applied thereon can be used.

Examples of redox electrolytes to be used in solar cells according to the present invention include a halogen redox electrolyte comprising a halogen compound and halogen molecule having a halogen ion as a counter ion, a metal oxidation-reduction type electrolyte of a metal complex or the like such as ferrocyanate-ferricyanate, ferrocene-ferricinium ion or the like and an aromatic redox electrolyte such as alkylthiol-alkyldisulfide, a viologen dye, hydroquinone-quinone or the like, and the halogen redox electrolyte is preferable. As the halogen molecule in the halogen redox electrolyte comprising halogen compound-halogen molecule, mentioned is, for example, an iodine molecule, a bromine molecule or the like, and the iodine molecule is preferable. Further, examples of the halogen compounds having a halogen ion as a counter ion include a halogenated metal salt, for example, LiI, NaI, KI, CsI, $CaI_2$ or the like, or an organic quaternary ammonium salt of halogen such as tetraalkylammonium iodide, imidazolium iodide, pyridinium iodide or the like, and a salt-type compound having the iodine ion as a counter ion is preferable. Examples of such salt-type compounds having the iodine ion as a counter ion include lithium iodide, sodium iodide, a trimethyl iodide ammonium salt and the like.

Further, when the redox electrolyte is constituted in a solution state containing itself, an electrochemically inert solvent is used as a solvent. Examples of such solvents include acetonitrile, propylene carbonate, ethylene carbonate, 3-methoxypropionitrile, methoxyacetonitrile, ethylene glycol, propylene glycol, diethylene glycol, triethylene glycol, γ-butyrolactone, dimethoxyethane, diethyl carbonate, diethyl ether, diethyl carbonate, dimethyl carbonate, 1,2-dimethoxy ethane, dimethyl formamide, dimethyl sulfoxide, 1,3-dioxolane, methyl formate, 2-methyl tetrahydrofuran, 3-methoxy-oxaziridine-2-one, sulfolane, tetrahydrofuran, water and the like. Among these solvents, particularly, acetonitrile, propylene carbonate, ethylene carbonate, 3-methoxypropionitrile, methoxyacetonitrile, ethylene glycol, 3-methoxyoxaziridine-2-one and the like are preferable. These solvents may be used either alone or in any combination of two or more types. In a case of the gel electrolyte, mentioned is a gel electrolyte which uses a polyacrylate or polymethacrylate resin or the like as a matrix. A concentration of the redox electrolyte is ordinarily from 0.01% by weight to 99% by weight and preferably from about 0.1% by weight to about 90% by weight.

The solar cell according to the present invention can be obtained by arranging the counter electrode against an electrode of the photoelectric conversion device adsorbing the dye in the oxide semiconductor thin film on the substrate such that the electrode of the photoelectric conversion device is interposed, and filling a solution containing the redox electrolyte between the electrode of the photoelectric conversion device and the counter electrode.

EXAMPLES

The present invention is now more specifically described with reference to Examples. However, it should be noted that these Examples should not be interpreted as limiting the present invention. Unless stated otherwise, all parts and percentages in these Examples are given by mass.

Synthesis Example 1

One part of cyanoacetic acid and 2 parts of N,N-diethylamino benzaldehyde were dissolved in 10 parts of ethanol and then 0.6 part of piperazine anhydride was added thereto dropwise. The resultant mixture was reacted under reflux for 2 hours and then cooled to obtain a solid. The thus-obtained solid was filtered, washed and dried, and then recrystallized with a mixed solvent of ethanol and hexane (ethanol: hexane=3:1), filtered, washed and thereafter dried to obtain 2.1 parts of a compound (2).

Melting point: from 185° C. to 187° C. (mel-temp used)

1H-NMR($\delta$(ppm): d6-DMSO)): 1.12(t, CH3, 6H), 3.43(q, CH2, 4H), 6.77(d, arom, 2H), 7.83(d, arom, 2H), 7.89(s, =CH—, 1H)

Mass spectrometry: M−1=243 (mw=244) (measured by using TOF MS available from Micromass Ltd. Under ESI negative mode)

Absorption maximum (methanol): 406 mm

Luminescence maximum (methanol): 476 mm

Synthesis Example 2

0.8 part of malonic acid and 1 part of 4-dimehylamino cinnamic aldehyde were dissolved in 10 parts of ethanol and, then, 0.3 part of piperazine anhydride was added thereto dropwise. The resultant mixture was reacted under reflux for 2 hours and then cooled to obtain a solid. The thus-obtained solid was filtered, washed and dried, and then recrystallized with a mixed solvent of ethanol and hexane, filtered, washed and thereafter dried to obtain 1.0 parts of a compound (34).

Melting point: from 160° C. to 165° C. (mel-temp used)

1H-NMR($\delta$(ppm): d6-DMSO)): 3.02(s, CH3, 6H), 6.74 (d, arom, 2H), 7.00(d, =CH—, 1H), 7.40(d,arom, 2H), 7.65(d, =CH—, 1H), 8.11(dd, =CH—, 1H)

Mass spectrometry: M−1=260 (mw=261) (measured by using TOF MS ESI available from Micromass Ltd. under negative mode)

Absorption maximum (methanol): 429 mm

Luminescence maximum (methanol): 562 mm

Compounds described below were synthesized by using materials corresponding to respective target compounds in a same manner as in the above-described synthesis examples. Compound numbers and respective physical properties are shown in Table 3.

TABLE 3

| Synthesis example | Melting point | Absorption maximum | Luminescence maximum | Mass spectrometry (molecular weight) |
|---|---|---|---|---|
| 1 | 212–214 | 416 nm | 469 nm | M − 1 = 215(216) |
| 7 | 230–235 | 418 nm | 540 nm | M − 1 = 339(340) |
| 28 | 165–166 | 381 nm | 489 nm | M − 1 = 289(290) |
| 29 | 155–160 | 317 nm | — | M − 1 = 280(281) |
| 33 | 165–170 | 433 nm | 565 nm | M − 1 = 241(242) |

Example

In regard to Examples from 1 to 21, a dye having an acrylic acid part was dissolved in EtOH in a concentration of $3 \times 10^{-4}$ M. In regard to Examples from 22 to 25, dyes were dissolved in EtOH such that each dye came to be in a concentration of $1.5 \times 10^{-4}$ M. In regard to Example 26, dyes were dissolved in EtOH such that each dye came to be in a concentration of $1 \times 10^{-4}$ M. In regard to Example 27, dyes were dissolved in EtOH such that each dye came to be in a concentration of $7.5 \times 10^{-3}$ M. In each of the resultant solutions, a porous substrate (semiconductor thin film electrode prepared by the steps of: dispersing titanium dioxide P-25 available from Nippon Aerosil Co., Ltd. in an aqueous solution of nitric acid, applying the thus-dispersed titanium dioxide on a transparent electrically conductive glass electrode in a thickness of 50 μm; and sintering the resultant electrode at 450° for 30 minutes) was immersed at room temperature for from 3 hours to one night to adsorbed the dye therein, washed with a solvent and dried to obtain a photoelectric conversion device of a dye-sensitized semiconductor thin film. Further, in Examples 2, 7, 9, 13, 16, 17, 18, 22, 26 and 27, an aqueous solution of 0.2 M titanium tetrachloride was added dropwise to a titanium oxide thin film portion of the semiconductor thin film electrode, it was left to stand at room temperature for 24 hours, and then washed with water and sintered again at 450° for 30 minutes to obtain a titanium tetrachloride-treated semiconductor thin film electrode. The dye was adsorbed in the thus-obtained titanium tetrachloride-treated semiconductor thin film electrode in the same manner.

Further, in Examples 4 and 10, when the dye solution was prepared, cholic acid was added as an inclusion compound such that it became to be $3 \times 10^{-5}$ M at the time the dye was adsorbed and, then, the resultant dye solution was adsorbed in the semiconductor thin film to obtain a cholic acid-treated dye-sensitized semiconductor thin film. An electrically conductive glass whose surface had been sputtered by platinum was fixed such that the thus-obtained dye-sensitized semiconductor thin film is interposed and, then, a gap generated therebetween was filled with an electrolyte-containing solution. Three types of such electrolyte-containing solutions were prepared. An electrolyte-containing solution A was prepared by dissolving iodine, lithium iodide, 1,2-dimethyl-3-n-propyl imidazolium iodide, t-butyl pyridine in 3-methoxypropionitrile such that concentrations thereof in 3-methoxypropionitrile became 0.1 M, 0.1 M, 0.6 M and 1 M, respectively. An electrolyte-containing solution B was prepared by dissolving iodine and tetra-n-propyl ammonium iodide in a mixed solution of ethylene carbonate and acetonitrile in a mixing ratio of 6 to 4 such that concentrations thereof in the mixed solution became 0.02 M and 0.5 M, respectively. An electrolyte-containing solution C was prepared by dissolving iodine and lithium iodide in propylene carbonate such that concentrations thereof became 0.05 M and 0.55 M in propylene carbonate, respectively.

A size of a cell used for measurements was set such that an execution part thereof was 0.25 cm². A light source was set to be 100 mW/cm through an AM 1.5 filter using a 500 W xenon lamp. Short circuit current, open circuit voltage, conversion efficiency and a form factor were measured by using a potentiogalvanostat.

Further, measurements on Comparative Examples were conducted in a same manner as in Example 1 by using the following Ru complex dye (131) and a merocyanine dye:

TABLE 4

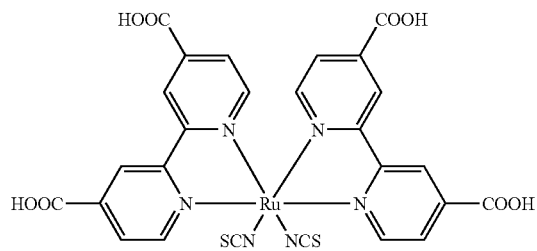
(131)

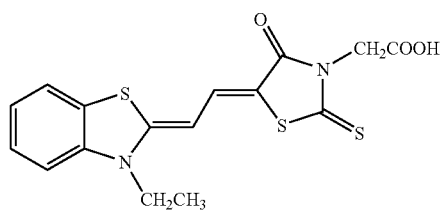
(132)

| | Compound No. | Short circuit current | Open circuit voltage | Conversion efficiency | TiCl4 treatment of thin film | Cholic acid treatment | Electrolytic solution |
|---|---|---|---|---|---|---|---|
| Example | | | | | | | |
| 1 | 1 | 5.7 | 0.56 | 1.5 | Untreated | Untreated | B |
| 2 | 2 | 5.1 | 0.74 | 2.2 | Treated | Untreated | B |
| 3 | 7 | 5.4 | 0.63 | 2.1 | Untreated | Untreated | A |
| 4 | 7 | 4.7 | 0.67 | 1.8 | Untreated | Treated | B |
| 5 | 10 | 4.6 | 0.65 | 2.0 | Untreated | Untreated | B |
| 6 | 12 | 5.5 | 0.67 | 2.3 | Untreated | Untreated | B |
| 7 | 13 | 5.0 | 0.74 | 2.3 | Treated | Untreated | B |
| 8 | 28 | 4.5 | 0.65 | 1.8 | Untreated | Untreated | B |
| 9 | 28 | 4.3 | 0.74 | 2.0 | Treated | Untreated | B |
| 10 | 29 | 0.4 | 0.46 | 0.1 | Untreated | Treated | A |
| 11 | 33 | 7.1 | 0.62 | 2.3 | Untreated | Untreated | C |
| 12 | 34 | 7.3 | 0.59 | 2.1 | Untreated | Untreated | C |
| 13 | 40 | 6.9 | 0.58 | 2.5 | Treated | Untreated | B |
| 14 | 41 | 5.7 | 0.57 | 2.1 | Untreated | Untreated | B |
| 15 | 50 | 5.0 | 0.53 | 1.7 | Untreated | Untreated | B |
| 16 | 86 | 2.3 | 0.66 | 1.0 | Treated | Untreated | B |
| 17 | 88 | 2.8 | 0.50 | 0.9 | Treated | Untreated | B |
| 18 | 90 | 3.2 | 0.67 | 1.4 | Treated | Untreated | B |
| 19 | 106 | 6.3 | 0.56 | 2.0 | Untreated | Untreated | B |
| 20 | 107 | 4.9 | 0.58 | 1.9 | Untreated | Untreated | A |
| 21 | 10 | 4.6 | 0.65 | 2.0 | Untreated | Untreated | B |
| 22 | 2 + 131 | 12.3 | 0.70 | 5.4 | Treated | Untreated | B |
| 23 | 2 + 41 | 9.6 | 0.61 | 2.4 | Untreated | Untreated | B |
| 24 | 33 + 41 | 9.3 | 0.55 | 2.6 | Untreated | Untreated | B |
| 25 | 40 + 132 | 9.2 | 0.64 | 3.8 | Untreated | Untreated | B |
| 26 | 7 + 41 + 132 | 10.5 | 0.66 | 4.1 | Treated | Untreated | B |
| 27 | 2 + 7 + 41 + 132 | 10.1 | 0.67 | 4.2 | Treated | Untreated | B |
| Comparative Example | | | | | | | |
| 1 | 131 | 11.0 | 0.71 | 4.5 | Untreated | Untreated | B |
| 2 | 132 | 6.3 | 0.56 | 2.4 | Untreated | Untreated | B |

INDUSTRIAL APPLICABILITY

In a dye-sensitized photoelectric conversion device according to the present invention, a solar cell having high conversion efficiency was able to be provided by using a dye having an acrylic acid part.

The invention claimed is:

1. A photoelectric conversion device, comprising oxide semiconductor fine particles sensitized with at least one dye represented by the following formula (1) having an acrylic acid part:

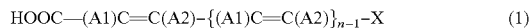

$$\text{HOOC—(A1)C}=\text{C(A2)-\{(A1)C}=\text{C(A2)\}}_{n-1}\text{-X} \qquad (1)$$

wherein A1 and A2 each independently represent a carboxyl group, a cyano group, an alkoxycarbonyl group, an acyl group, a nitro group, a cyclic hydrocarbon residue which may be substituted, a heterocyclic residue which may be substituted, an amino group which may be substituted, a hydroxyl group, a hydrogen atom, a halogen atom or an alkyl group which may be substituted; X represents an aromatic hydrocarbon residue which may be substituted, a heterocyclic residue which may be substituted, or an organic metal complex residue which may be substituted; n represents an integer of from 1 to 6; when n is 2 to 6 and a plurality of A1 and a plurality of A2 are present, each A1 and each A2 independently represent any one of the groups or residues defined above for A1 and A2 which may be the same with or different from each other, and further, except for the A1 bond to the carbon atom to which the carboxyl group in an acrylic part is bound, two A1s or each A1 in a plurality of A1, two A2s or each A2 in a plurality of A2 and X may be bound together to form a ring selected from the group consisting of a benzene ring, a naphthalene ring, an indene ring, a pyridine ring, a pyrazine ring, a thiophene ring, a furan ring, an oxazole ring, a thiazole ring, an indole ring, a benzothiazole ring, a benzoxazole ring, a quinoline ring and a carbazole ring.

2. The photoelectric conversion device as set forth in claim 1, wherein n is from 1 to 3 in the formula (1).

3. The photoelectric conversion device as set forth in claim 1, characterized in that at least one of A1 and A2 or, when a plurality of A1 and a plurality of A2 are present, at least one thereof is a cyano group or a carboxyl group in the formula (1).

4. The photoelectric conversion device as set forth in claim 3, characterized by that A1 in the formula (1) is a cyano group or a carboxyl group and wherein the A1 binds to the same carbon atom as the carboxyl group in an acrylic part.

5. The photoelectric conversion device as set forth in any one of claims 1 to 4, wherein X in the formula (1) is an aromatic hydrocarbon residue having a substituted amino group.

6. The photoelectric conversion device as set forth in claim 3, wherein X of the formula (1) is an aromatic hydrocarbon residue having a substituted amino group and comprising an aromatic ring having from 6 to 16 carbon atoms.

7. The photoelectric conversion device as set forth in claim 6, wherein X of the formula (1) is a phenyl group having a mono- or di- (C1 to C4) alkyl-substituted amino group, wherein said phenyl group may further be substituted by one or two substituents selected from the group consisting of a halogen atom, an alkyl group having from 1 to 4 carbon atoms and an alkoxy group having from 1 to 4 carbon atoms.

8. The photoelectric conversion device as set forth in claim 3, wherein X is an aromatic hydrocarbon residue having a substituted amino group or A2 or X is a heterocyclic residue which is a 5- or 6-membered ring containing from 1 to 3 hetero atoms and may be substituted, or a heterocyclic residue comprising a condensed ring, having from 8 to 15 carbon atoms, which contains a 5- or 6-membered heterocycle containing from 1 to 3 hetero atoms, or the ring formed by binding of two A1s or each A1 in a plurality of A1, two A2s or each A2 in a plurality of A2 and X is a pyridine ring, a pyrazine ring, a thiophene ring, a furan ring, an oxazole ring, a thiazole ring, an indole ring, a benzothiazole ring, a benzoxazole ring, a quinoline ring, or carbazole ring, characterized by comprising oxide semiconductor fine particles comprising at least one dye having an acrylic acid part and sensitized with simultaneously using two or more sensitizing dyes.

9. The photoelectric conversion device as set forth in claim 7, characterized by comprising oxide semiconductor fine particles sensitized by simultaneously using three or more sensitizing dyes.

10. The photoelectric conversion device as set forth in any one of claims 1 to 4, wherein the oxide semiconductor fine particles comprise titanium dioxide as an essential component.

11. The photoelectric conversion device as set forth in any one of claims 1 to 4, wherein a dye is absorbed in the oxide semiconductor fine particles in the presence of an inclusion compound.

12. A solar cell, characterized by comprising the photoelectric conversion device as set forth in any one of claims 1 to 4.

13. The photoelectric conversion device as set forth in claim 7, characterized by comprising oxide semiconductor fine particles comprising at least one dye having an acrylic acid part and sensitized with simultaneously using two or more sensitizing dyes.

14. The photoelectric conversion device as set forth in claim 13, wherein the oxide semiconductor fine particles comprise titanium dioxide as an essential component.

15. The photoelectric conversion device as set forth in claim 7, wherein a dye is absorbed in the oxide semiconductor fine particles in the presence of an inclusion compound.

16. The photoelectric conversion device as set forth in claim 13, wherein a dye is absorbed in the oxide semiconductor fine particles in the presence of an inclusion compound.

17. The photoelectric conversion device as set forth in claim 1, wherein, when n is 1, X of the formula (1) is a phenyl group having a mono- or di- ($C_1$ to $C_{20}$) alkyl-substituted amino group or having a mono-or di-phenyl amino group wherein the phenyl may be substituted by methyl, or X is carbazole which may be substituted, and when n is 2 or 3, X of the formula (1) is an aromatic hydrocarbon residue which may be substituted, a heterocyclic residue which may be substituted, or an organic metal complex residue which may be substituted.

* * * * *